United States Patent [19]
Sugiyama et al.

[11] Patent Number: 5,392,307
[45] Date of Patent: Feb. 21, 1995

[54] VERTICAL OPTOELECTRONIC SEMICONDUCTOR DEVICE

[75] Inventors: Yoshihiro Sugiyama; Yoshiaki Nakata, both of Kawasaki, Japan

[73] Assignee: Fujitsu Limited, Kawasaki, Japan

[21] Appl. No.: 113,829

[22] Filed: Aug. 31, 1993

[30] Foreign Application Priority Data

Mar. 15, 1993 [JP] Japan .................. 5-054308

[51] Int. Cl.$^6$ .................................. H01S 3/19
[52] U.S. Cl. .......................... 372/45; 372/46; 372/96
[58] Field of Search .................. 372/45, 46, 96

[56] References Cited

U.S. PATENT DOCUMENTS

| | | | |
|---|---|---|---|
| 5,088,099 | 2/1992 | Chen et al. | 372/45 |
| 5,146,465 | 9/1992 | Khan et al. | 372/45 |
| 5,208,820 | 5/1993 | Kurihara et al. | 372/45 |
| 5,216,686 | 6/1993 | Halm et al. | 372/96 |
| 5,229,627 | 7/1993 | Kasaka | 372/99 |
| 5,237,581 | 8/1993 | Asada et al. | 372/45 |
| 5,255,278 | 10/1993 | Yamanaka | 372/96 |
| 5,289,018 | 2/1994 | Okuda et al. | 372/45 |

OTHER PUBLICATIONS

R. S. Geels et al., *Low Threshold Planarized Vertical-Cavity Surface-Emitting Lasers,* IEEE Photonic Technology Lett., vol. 2, No. 4, 234 (1990) Apr.
K. Tai et al., *Drastic Reduction of Series Resistance in Doped Semiconductor Distributed Bragg Reflectors for Surface-Emitting Lasers,* Applied Physics Lett., 56 (25), 2496 (1990) Jun.

*Primary Examiner*—Georgia Y. Epps
*Attorney, Agent, or Firm*—Staas & Halsey

[57] ABSTRACT

An active layer having a predetermined effective band gap, a predetermined effective refractive index, and a predetermined thickness is sandwiched between a first clad layer and a second clad layer. Each of the clad layers has an effective band gap wider than that of the active layer, an effective refractive index lower than that of the active layer, and a predetermined thickness. On the first clad layer, there is disposed a first stack structure doped to a first conductivity type, which alternately includes a layer of a high refractive index and a layer of a low refractive index, and has a discontinuity of a band of the first conductivity type made quite smaller than that of a band of a second conduction type. On the second clad layer, there is disposed a second stack structure doped to the second conductivity type, which alternately includes a layer of a high refractive index and a layer of a low refractive index, and has a discontinuity of a band of the second conductivity type made quite smaller than that of the band of the first conductivity type. Each of the first and second stack structures serves as an optical filter and also forms a low-resistance conduction path.

18 Claims, 7 Drawing Sheets

FIG. 4A $$-\Delta E_c = 1.66 - 0.53x \ (eV)$$
$$\Delta E_v = 0.03 + 0.19x \ (eV)$$

FIG. 4B $$\Delta E_c = -0.06 + 1.19y \ (eV)$$
$$-\Delta E_v = 0.69 - 0.47y \ (eV)$$

VERTICAL OPTOELECTRONIC SEMICONDUCTOR DEVICE

BACKGROUND OF THE INVENTION

The present invention relates to an optoelectronic semiconductor device, and in particular, to an optoelectronic semiconductor device having heterojunctions.

In an ordinary semiconductor laser, on an active layer formed in a substrate thereof, laminated layers are epitaxially grown to form heterojunctions between the active layer and the laminated layers. In the laser, a light produced therein is propagated through the active layer in a planar direction thereof, thereby emitting the light from a side surface thereof. Although a plurality of lasers may be integrally manufactured in a single chip, the arrangement of the lasers with respect to lights radiated therefrom is limited due to the configuration thereof to, for example, a one-dimensional disposition on the same plane.

In a semiconductor laser of a plane or surface emission type (to be referred to as a surface emission laser herebelow), a laser beam is emitted in a direction perpendicular to a substrate surface thereof. In a case where a plurality of surface emission lasers are manufactured as an integrated circuit in a single chip, laser lights emitted therefrom can be arbitrarily arranged in a two-dimensional plane.

Consequently, the surface emission laser is quite advantageously applicable to light communications such as a multiplexed light communication employing laser beams. In the following paragraphs, description will be given of the present invention primarily, but not limitatively, in conjunction with the surface emission laser by way of example.

Figure 6A:
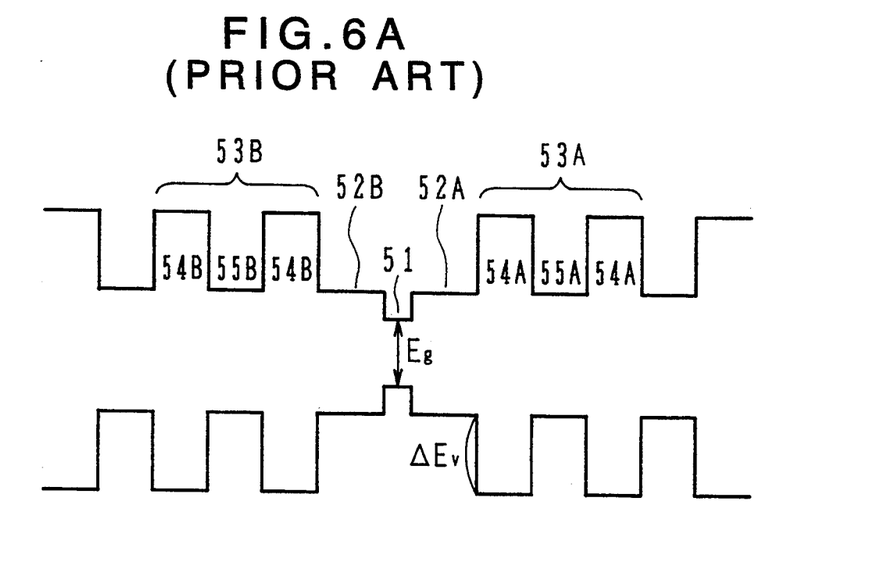
FIGS. 6A and 6B are schematic diagrams for explaining the configuration of a surface emission laser according to the prior art.
Figure 6B:
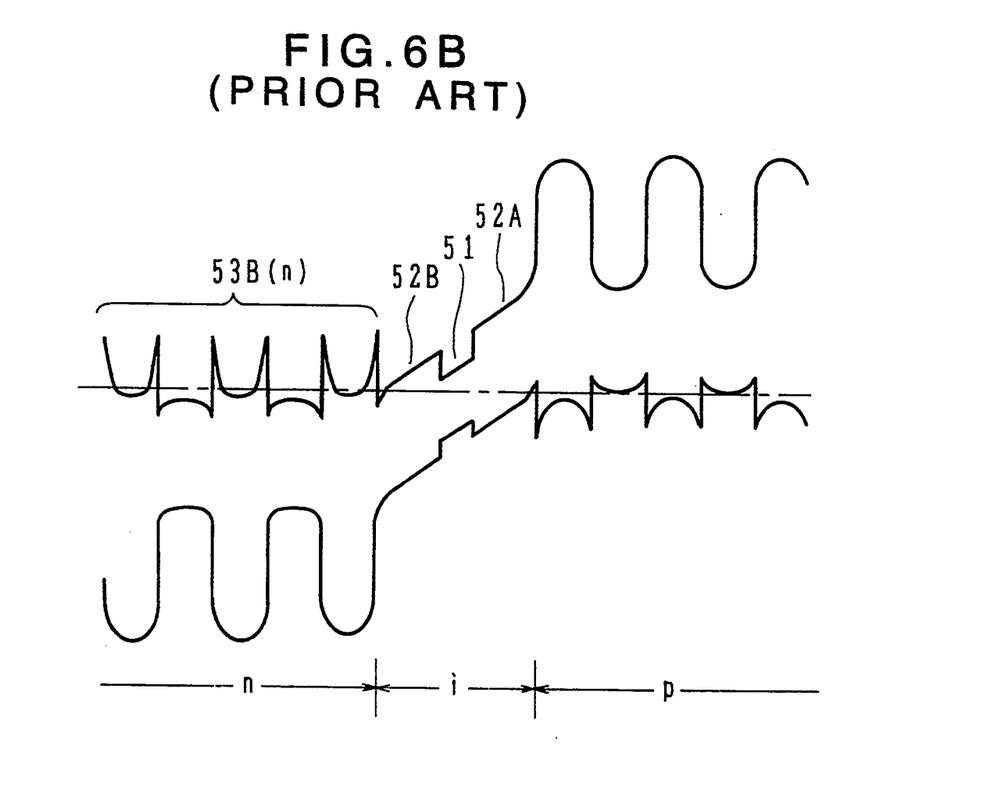

In a surface emission laser, to form an optical cavity, a reflection mirror is disposed on each of the opposing end sides of an active layer conducting light. The mirror can be configured in the form of a distributed Bragg reflector (DBR) including a multi-layered film or stack developing a periodic change in a refractive index thereof. When the change occurs at an interval of an optical length $\lambda/4$ or a quarter wavelength, the sum of multiple reflection of light having a wavelength $\lambda$ takes a maximum value thereof. FIGS. 6A and 6B show states of a main section of a surface emission laser according to the conventional technique. FIG. 6A schematically shows a band structure of an active layer, clad layers disposed on both sides thereof, and DBR layers formed on both end sides of the resultant constituent block including the active layer and the clad layers. In the band structure diagram, the ordinate represents values of energy and the abscissa stands for positions along depth of the laser.

In the diagram, an active layer 51 has a predetermined energy gap Eg. Disposed on both ends of the active layer 51 are clad layers 52A and 52B each having a band gap larger than that of the active layer 51 and a refractive index smaller than that of the active layer 51. Each of the active layer 51 and clad layers 52A, and 52B is configured with a non-doped semiconductor layer. Each of the clad layer may be replaced with a laminated of a plurality of different layers.

On an outside end of the clad layer 52A, there are laminated semiconductor layers forming a first DBR structure 53A. Moreover, on an outside end of the clad layer 52B, semiconductor layers are similarly piled to form a second DBR structure 53B.

The first DBR stack 53A includes a semiconductor layer 54A having a wide band gap and a semiconductor layer 55A having a narrow band gap, which are successively arranged in an alternate manner. The second DBR stack 53B includes a semiconductor layer 54B of a wide band gap and a semiconductor layer 55B of a narrow band gap, which are similarly disposed in an alternate manner.

Each of the layers 54A, 54B, 55A, and 55B has an optical length $\lambda/4$ for a wavelength $\lambda$ of light radiated from the active layer 51. In this connection, the optical length $\lambda/4$ implicitly includes $3\lambda/4$, $5\lambda/4$, etc. developing optically the same function as $\lambda/4$. Furthermore, the optical length need not be exactly identical to $\lambda/4$. Particularly, the layer thickness of the outer-most layer has a wide allowance for the optical length.

In a semiconductor, a refractive index is related to a band gap thereof. Generally, a semiconductor having a wide band gap possesses a small value of refractive index. Consequently, each of the DBR structures 53A and 53B develops a variation in a refractive index according to a change in the band gap thereof, and a hetero-boundary surface thereof forms an optical boundary surface. Since each semiconductor layer has the thickness $\lambda/4$, the light emitted from the active layer 51 and having the wavelength $\lambda$ is reflected by the DBR structures 53A and 53B. Namely, this configuration forms a resonator.

In order to cause radiative recombinations in the active layer 51, it is only necessary to dope impurity substances in the DBR stacks 53A and 53B so as to constitute a pin diode structure.

FIG. 6B shows a band structure developed when a pin structure obtained by doping a p-type impurity substance to the DBR structure 53A and an n-type impurity substance to the DBR structure 53B is under the thermal equilibrium.

In a semiconductor layer having a wide band gap, since carriers including electrons and holes are moved to a semiconductor layer having a narrow band gap, there appears space (fixed) charges of a reverse polarity. This leads to a band bending effect, namely, the band is curved.

The curve impedes the carrier transfer through a semiconductor layer having a wide band gap. Since there are formed a plurality of such potential barriers, the forward-directional resistance of the pin diode becomes to be increased, for example, to several kiloohms (k$\Omega$).

Figure 7A:
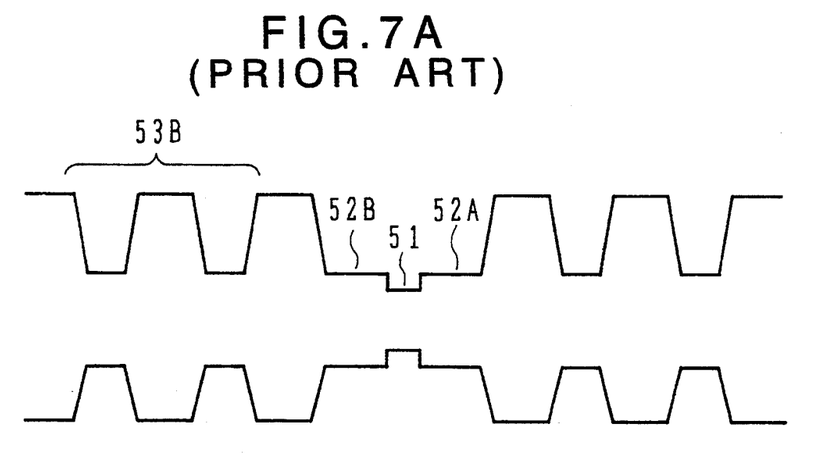
FIGS. 7A and 7B are schematic diagrams for explaining the configuration of a surface emission laser improved according to the conventional technology.
Figure 7B:
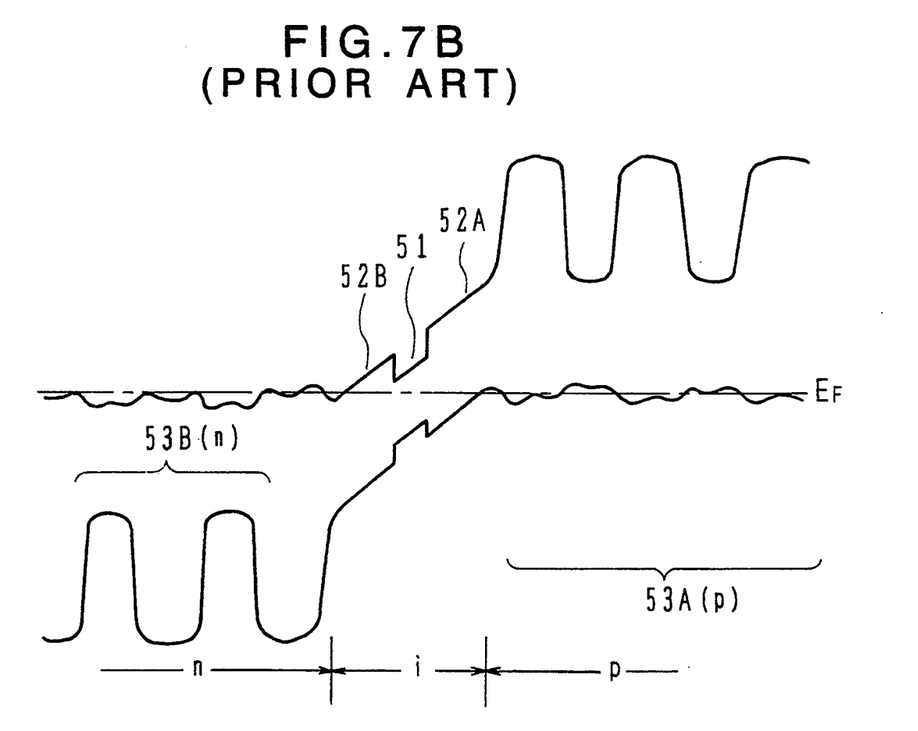

FIGS. 7A and 7B illustratively show states of a pin diode configuration including DBR structures capable of decreasing the forward resistance. In FIG. 7A, the diode is in the abscence of an electric field; whereas, in FIG. 7B, the diode is under the thermal equilibrium.

In FIGS. 7A and 7B, there appears a composition gradient in the neighborhood of each of the hetero-boundaries of the DBR stacks 53A and 53B and hence the band gaps thereof are gradually changed. The spike-like potential barrier does not appear due to the composition gradient and the doping. This prevents an abrupt potential barrier from being formed therein. There has been reported that the resistance of a pin diode is decreased to about 12 ohms by use of the device configuration as above realized by equivalent superlattice structure.

Incidentally, when manufacturing a surface emission laser, it is essential to exactly control arrangement of each layer constituting the DBR structures.

When each of the DBR layers is manufactured to have a uniform composition, it is difficult to lower the resistance of the pin diode. Although the resistance can be decreased by forming heterojunctions of the composition gradient type as above, the regions of the composition gradient are required to be fabricated in a region of the order of 100 angstrom (Å) with each layer of a thickness of 20 to 100 angstroms (Å), which cannot be easily achieved. Consequently, it is quite difficult to manufacture, according to the prior art, a surface emission laser which includes the DBR structures of the favorable configuration as above and which hence develops a low forward resistance.

SUMMARY OF THE INVENTION

It is therefore an object of the present invention to provide an optoelectronic semiconductor device including semiconductor layers and developing favorable optical characteristics and a low forward resistance.

Another object of the present invention to provide a surface emission laser including DBR structures developing favorable optical characteristics and a low forward resistance.

According to one aspect of the present invention, there is provided an optoelectronic semiconductor device including an active layer having a predetermined effective band gap, a predetermined effective refractive index, and a predetermined thickness; a first clad layer and a second clad layer vertically enclosing the active layer, each of the clad layers having an effective band gap wider than that of the active layer, an effective refractive index smaller than that of the active layer, and a predetermined thickness; and a first laminated layer structure disposed on the first clad layer and doped to a first conductivity type. The structure includes a high-index layer having a high effective refractive index and a low-index layer having a low effective refractive index, the layers being successively and alternately arranged therein. Discontinuity of a band of the first conductivity type is quite smaller than that of a band of a second conduction type.

Since the first stack disposed on the first clad layer includes a high-index layer having a high effective refractive index and a low-index layer having a low effective refractive index which are successively and alternately arranged such that discontinuity of a band of a first conductivity type is remarkably smaller than that of a band of a second conduction type, carriers of the first conductivity type can be transferred therethrough at a high speed.

Since it is unnecessary to dispose composition gradients as above, each layer of the first stack can be easily fabricated with a high precision, thereby facilitating implementation of satisfactory optical characteristics. For example, it is possible to easily manufacture an optical filter having favorable DBR structures.

As described above, there is provided an optoelectronic semiconductor device in a diode structure developing a low resistance and desirable optical characteristics.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1A:
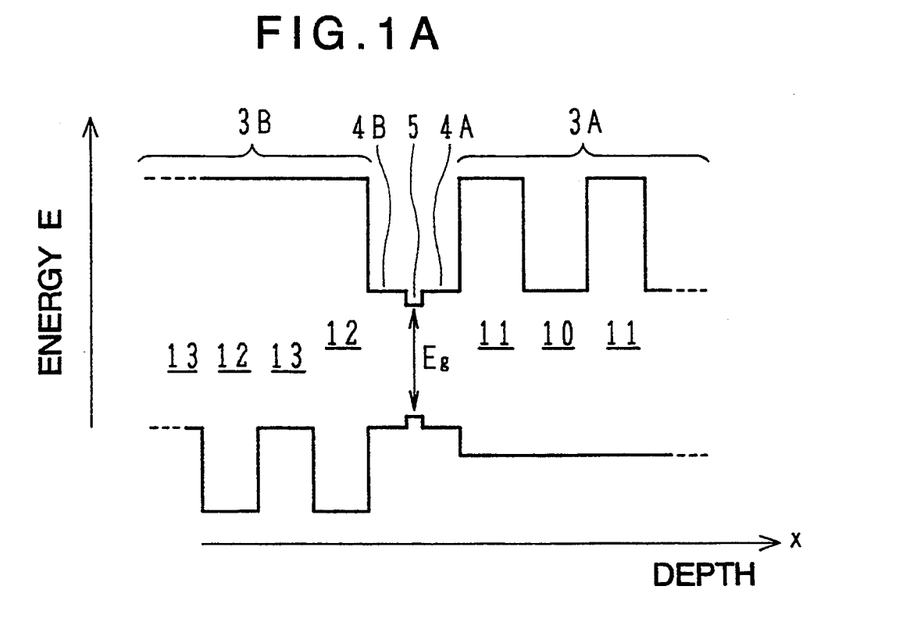
FIGS. 1A and 1B are schematic diagrams for explaining functions of an optoelectronic semiconductor device in a fundamental embodiment according to the present invention.
Figure 1B:
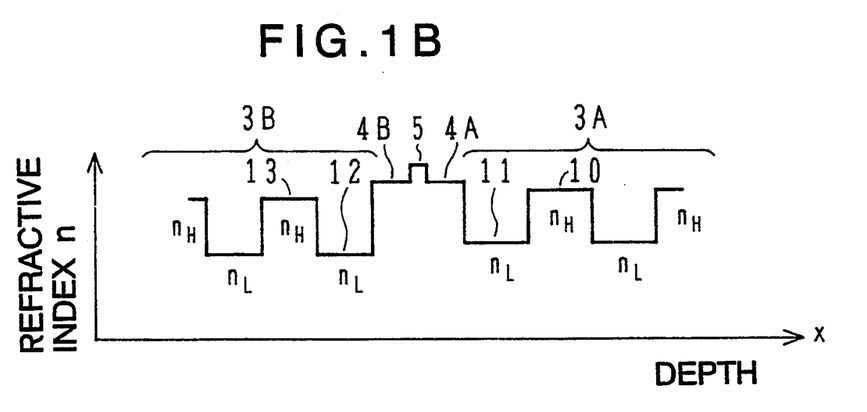

FIGS. 1A and 1B show a basic structure of an optoelectronic semiconductor device according to the present invention. FIG. 1A schematically shows a band structure of laminated semiconductor layers in a principal portion of the device.

In this configuration, an active layer 5 includes a semiconductor layer which has a band gap Eg and in which radiative recombinations can take place. Clad layers 4A and 4B each having a band gap wider than that of the active layer 5 are disposed to vertically enclose or interpose the active layer 5 therebetween. Formed on the clad layer 4A is a first laminated semiconductor layer structure 3A. Also, a second laminated semiconductor layer structure 3B is fabricated on the clad layer 4B.

The semiconductor layer stack or lamination 3A includes a semiconductor layer 10 having a narrow band gap and a semiconductor layer 11 having a wide band gap, which are alternately arranged in a successive fashion. In the structure alternately including the semiconductor layers 10 and 11, a large band discontinuity appears in a conduction band. In contrast therewith, such a band discontinuity is substantially missing in a valence band.

The semiconductor stack 3B includes a semiconductor layer 12 possessing a wide band gap and a semiconductor layer 13 having a narrow band gap, which are alternately fabricated in a successive manner. In the structure in which the semiconductor layers 12 and 13 are successively and alternately arranged, a large band discontinuity appears in a valence band; whereas, a band discontinuity is substantially missing in a conduction band.

Owing to provision of the semiconductor layer stacks having the characteristics as above, when a p-type impurity material is doped in the stack 3A, a hole as a p-type carrier is not substantially hindered by any potential barrier and hence can easily travel through the structure 3A.

Also, when an n-type impurity material is doped in the stack 3B, an electron as an n-type carrier is not hindered by any potential barrier and hence can easily pass through the stack 3B.

FIG. 1B schematically shows a distribution of refractive index values of the stack structures of FIG. 1A. The refractive index of a semiconductor is inversely proportional to the magnitude of a band gap. Consequently, the refractive index takes a maximum value in the active layer 5 having the minimum band gap. Each of the clad layers 4A and 4B between which the active layer 5 is interposed has a refractive index smaller than that of the active layer 5. This resultantly leads to a carrier confinement effect and an optical confinement effect in the active layer 5.

In the stack 3A disposed on the outside end of the clad layer 4A, the semiconductor layer 11 having a wide band gap develops a low refractive index nL and the semiconductor layer 10 having a narrow band gap possesses a high refractive index nH. These layers 11 and 10 are alternately arranged in a successive fashion. Due to the distribution of the refractive index value as above, there is implemented an optical filter.

When each of the layers 10 and 11 has an optical length substantially equal to $\lambda/4$ for a predetermined wavelength $\lambda$, the stack 3A constitutes a DBR structure. In this connection, the optical length is an optical length of a semiconductor layer measured along a direction of light propagation. Namely, when the light is propagated in a direction vertical to the semiconductor layer, the optical length is expressed as a product between the thickness of the layer and the effective refractive index thereof.

The stack 3B also achieves fundamentally the same function as the stack 3A. However, the desired thickness of each of the stacks is determined according to the values, respectively, of the refractive indices nH and nL. When the optical length $\lambda/4$ is assigned to each layer, there is implemented the DBR structures.

As shown in FIG. 1A, in the stacks of semiconductor layers having an extremely small band discontinuity in one band, the value of discontinuity is ideally to be "0". However, actually, carriers to be transported through the lamination have a thermal energy and also can be accelerated by an electric field. In practice, consequently, the band discontinuity need only take a value of about ±3 kT or less. In consideration of operation of the device at a room temperature, it is only necessary to set the value to at most about ±78 meV.

According to the optoelectronic semiconductor device shown in FIGS. 1A and 1B, there is provided a low-resistance pin diode configuration having a desired function of an optical filter. The structure of this kind is applicable to various optoelectronic semiconductor devices in which light is propagated through the active layer 5 and the clad layers 4A and 4B.

Figure 2:
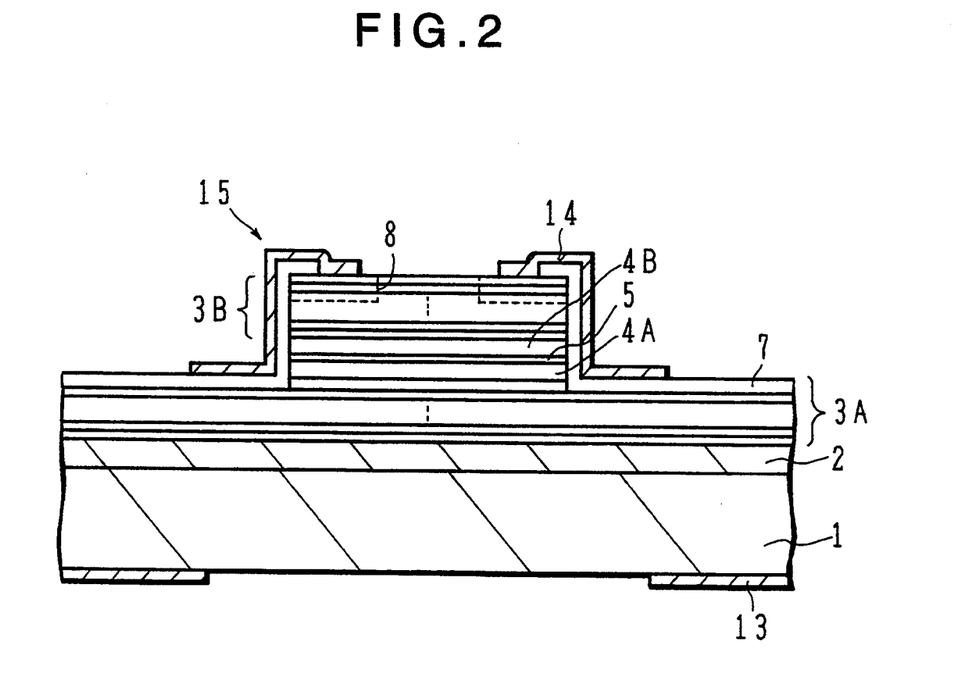
FIG. 2 is a cross-sectional view of a surface emission laser in an embodiment according to the present invention.

FIG. 2 shows in a partial cross-sectional diagram a surface emission laser in an embodiment according to the present invention.

In the constitution of FIG. 2, a p-type InP buffer layer 2 is epitaxially grown on a p+-type (001) InP substrate 1. On the layer 2, there is fabricated through an epitaxial growth technique a DBR structure 3A including a lamination of layers implemented by repeatedly forming an alternating combination of a layer of $In_{0.52}(Al_xGa_{1-x})_{0.48}As$ and a layer of $AlAs_{0.44}Sb_{0.56}$, which are doped with a p-type impurity substance.

The thickness of each layer of the DBR structure 3A is selected such that the layer has an optical length of a quarter wavelength ($\lambda/4$) for a light having a wavelength of 1.55 micrometers ($\mu m$). The structure 3A is obtained by forming 30 pairs of an alternate stack or lamination of In(AlGa)As/AlAsSb.

The p-type impurity material is doped such that, for example, the concentration of beryllium atoms is about $3.6 \times 10^{19} cm^{-3}$ and about $5.6 \times 10^{19} cm^{-3}$ for the In(AlGa)As and AlAsSb layers, respectively.

Figure 4A:
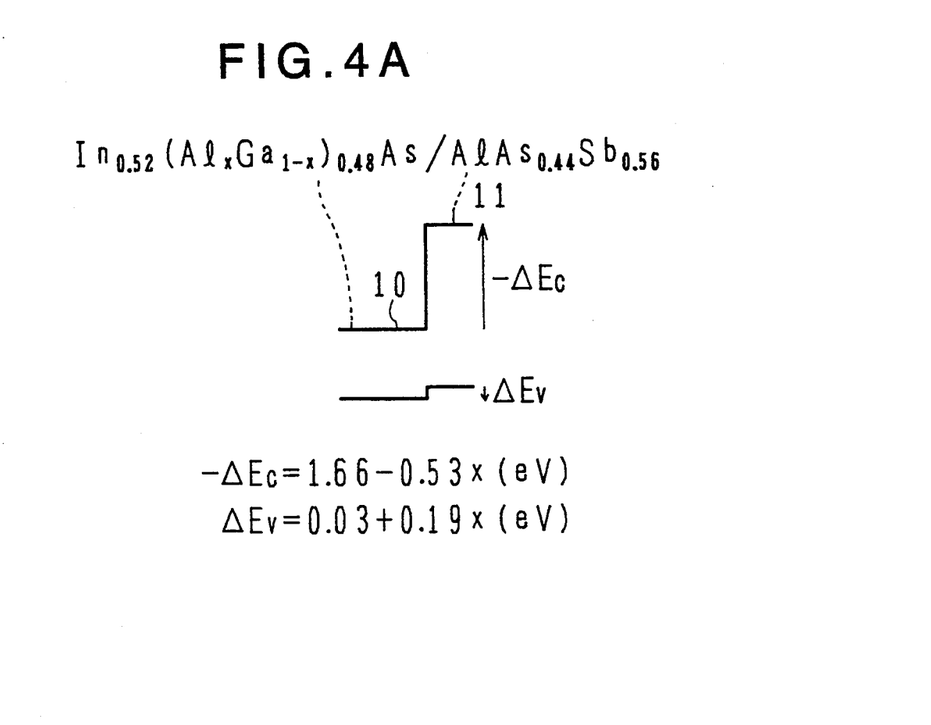
FIGS. 4A and 4B are diagrams for explaining a DBR structure of the surface emission laser of FIGS. 2 and 3.

As shown in FIG. 4A, the band discontinuity ($\Delta Ec$ for the conduction band and $\Delta Ev$ for the valence band) between $In_{0.52}(Al_xGa_{1-x})_{0.48}As$ and $AlAs_{0.44}Sb_{0.56}$ can be represented as follows.

$-\Delta Ec = 1.66 - 0.53x$ $\Delta Ev = 0.03 + 0.19x$

For x=0.15, these values are attained as $\Delta Ec = 1.58$, and $\Delta Ev = 0.059$ (Ev).

Since the value of $\Delta Ev$ is sufficiently smaller than the thermal energy at a room temperature 3kT=78 meV, it is possible to satisfactory reduce the resistance of the DBR structure 3A as a whole against the transfer of holes therethrough.

In this regard, thanks to the 30 periods of partial stacks thus repeatedly fabricated as above, for light having a wavelength of 1.55 $\mu m$, there can be obtained a reflection R of about 99%.

On the DBR structure 3A, the lower clad layer 4A, an active layer 5, and an upper clad layer 4B are epitaxially grown. For example, as the lower clad layer 4A, a non-doped $In_{0.52}(Al_xGa_{1-x})_{0.48}As$ layer is grown to have a thickness of about 2400 angstroms (Å); as the active layer 5, an $In_{0.53}Ga_{0.47}As$ layer is grown to have a thickness of about 80; and as the upper clad layer 4B, $In_{0.52}(Al_xGa_{1-x})_{0.48}As$ layer is grown to have a thickness of about 2400 Å. In this connection, the value of x may be set to 0.15, for example.

Subsequently, on the upper clad layer 4B, an alternative stack including an $In_{0.52}Al_{0.48}As$ layer and an $Al_yGa_{1-y}As_{0.44}Sb_{0.56}$ layer is repetitiously formed 25 times, thereby providing a 25-period DBR structure 3B. In this regard, as an n-type impurity substance, silicon atoms are doped in the InAlAs and AlGaAsSb layers to set the concentration thereof to about $1.3 \times 10^{18} cm^{-3}$ and about $2.6 \times 10^{17} cm^{-3}$, respectively. The thickness of each of the AlGaAsSb and InAlAs layers is selected to develop an optical length of $\lambda/4$ for light having a wavelength of 1.55 $\mu m$.

Figure 4B:
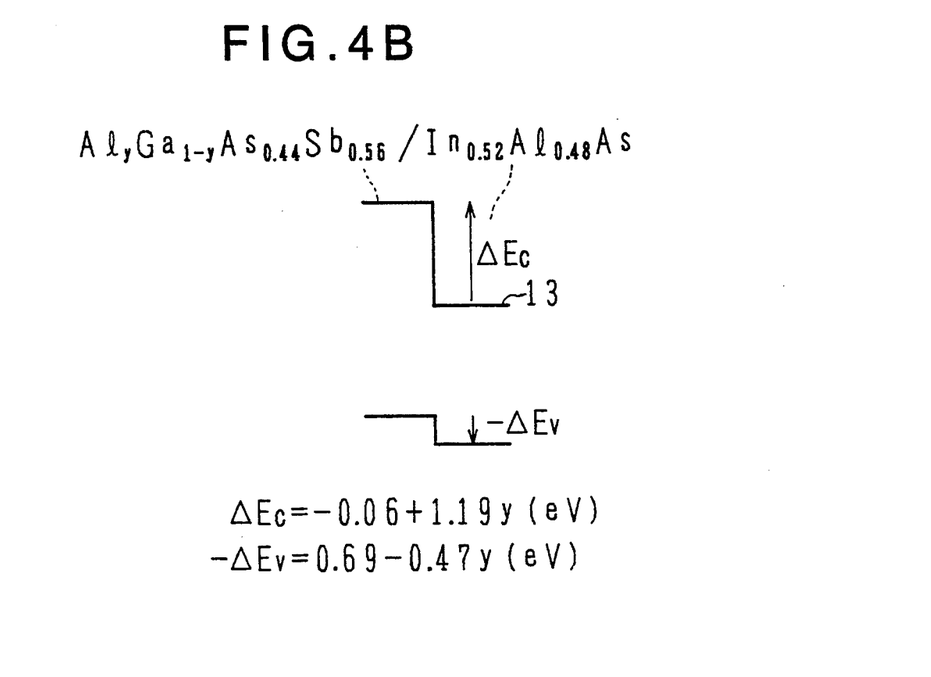

As can be seen from FIG. 4B, the band discontinuity values $\Delta Ec$ and $\Delta Ev$ between the alternating AlGaAsSb and InAlAs layers can be represented as follows:

$\Delta Ec = -0.06 + 1.19y$, and $-\Delta Ev = 0.69 - 0.47y$.

For y=0.05, these values are obtained as $\Delta Ec = 0$ $-\Delta Ev = 0.67$ (eV).

Assuming y=0.1, the value of $\Delta Ec$ becomes to be 0.035 eV. This value is also sufficiently smaller than the thermal energy, about 78 meV, of the carrier at the room temperature.

Figure 5:
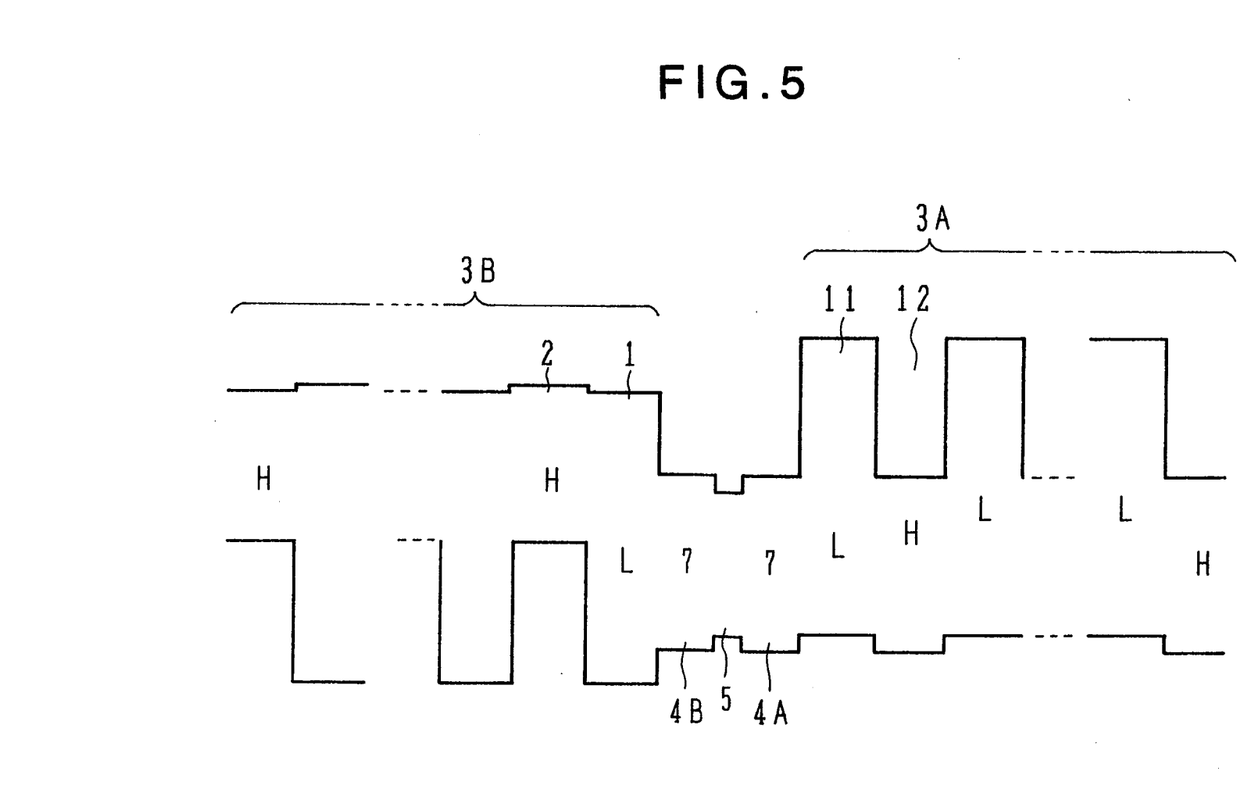
FIG. 5 is a schematic diagram for explaining a band structure of the surface emission laser of FIGS. 2 and 3.

FIG. 5 schematically shows a band structure of a portion including the DBR structure 3A, the lower clad layer 4A, the active layer 5, the upper clad layer 4B, and the DBR layer 3B. The ordinate and the abscissa respectively indicate values of energy and positions along the layer lamination direction.

In the DBR structure 3A, the clad layer 4A, and the active layer 5, there is missing a high potential barrier in the valence band and hence holes can be transferred with a low resistance. In the DBR structurre 3B, the clad layer 4B, and the active layer 5, there is missing a high potential barrier against a transfer of electrons from the DBR structure 3B to the active layer 5, which enables electrons to flow therethrough with a low resistance.

Moreover, in each of the DBR structures 3A and 3B, the band gap changes periodically and hence there appears a periodic alteration in the refractive index according to the band gap variation, thereby implementing an optical DBR. In this connection, the DBR structure 3B has a reflection coefficient R (3B) lower than that of the DBR structure 3A, R(3A) and the generated light is primarily emitted from the DBR structure 3B.

Returning to FIG. 2, after completion of the epitaxial growth of the DBR structure 3B, an about 300 Å thick Au-Ge layer and an about 2000 Å thick Au layer are formed in a region surrounding a light emission region in the region implementing the surface emission diode. The resultant structure is then subjected to an alloying process in a H$_2$ atmosphere at about 450° C. for about three minutes, thereby obtaining an ohmic contact regions 8.

Thereafter, to obtain a portion of the surface emission diode, the half-finished substrate is mesa-etched to manufacture a mesa structure 15. After achieving a mesa etching on the mesa structure 15, an about 3500 Å thick SiO$_2$ layer 7 is piled thereon and then is selectively removed at a top portion of the mesa structure 15 to expose the ohmic contact regions 8.

As an upper electrode region 14, an about 200 Å thick Ti layer and an about 3000 Å thick Au layer are successively formed such that the electrode region 14 extends from a surface of the SiO$_2$ layer 7 to the ohmic contact regions 8 of the DBR structure 3B thus exposed.

In addition, on a bottom surface of the InP substrate 1, an about 500 Å thick Au-Zn layer and an about 2000 Å thick Au layer are formed with a window portion as a lower electrode region 13. After the electrode region 13 is formed, the semimanufactured substrate is subjected to an alloying in a H$_2$ atmosphere at about 420° C. for about one minute. In this way, a surface emission laser is formed.

Figure 3:
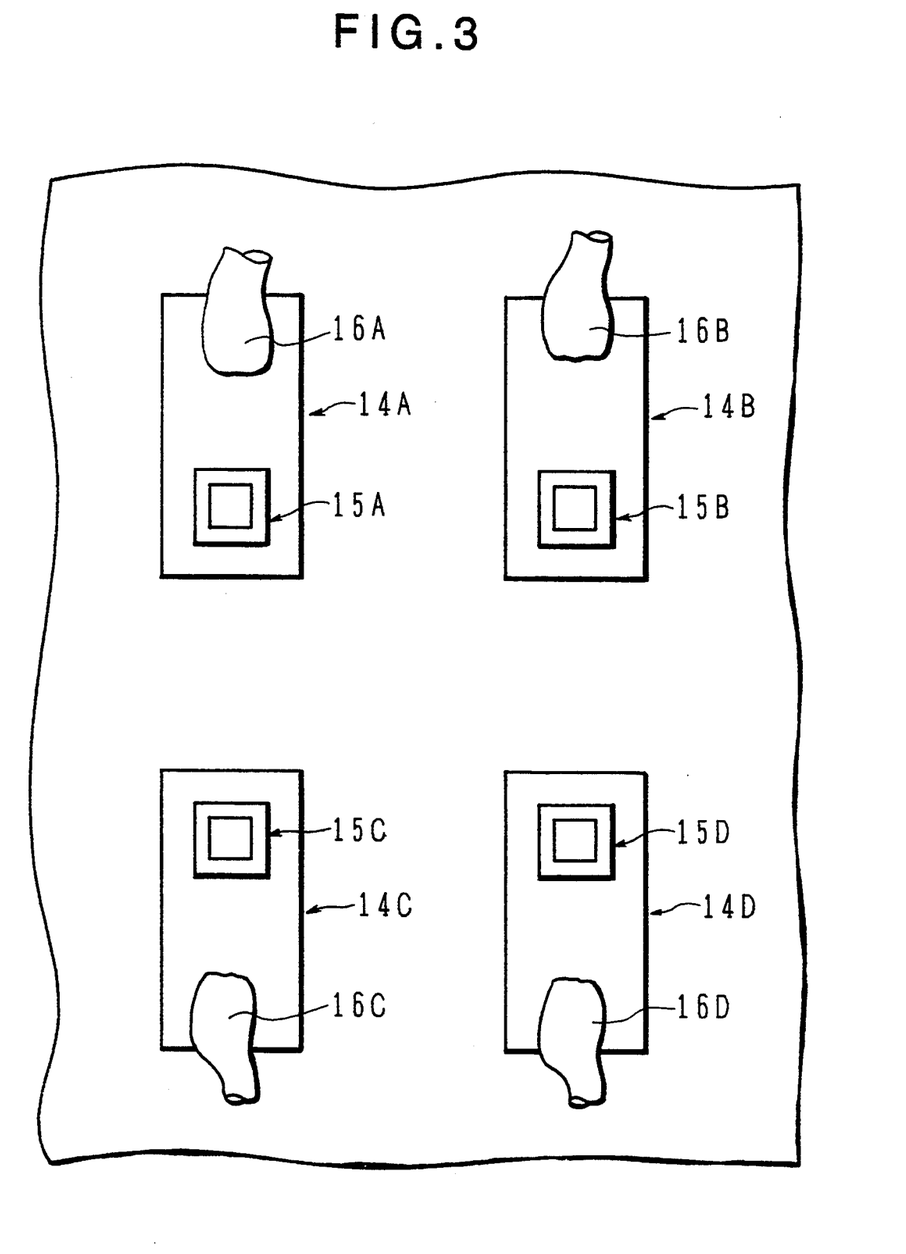
FIG. 3 is a plan view of the surface emission laser of FIG. 2.

FIG. 3 is a schematic plan view of the surface emission laser. Four mesa structures 15A to 15D are disposed on the chip surface as shown in the diagram. Upper electrode regions 14A to 14D extend from the respective mesa structures 15A to 15D and lead wires 16A to 16D are bonded onto the extended portions of the electrode regions 14A to 14D, respectively.

In this regard, in the top portion of each mesa structure, the upper electrode region 14 includes an opening to serve as a light emission window for the light emission from the surface emission laser. The size of the mesa structure 15 is, for example, 20 μm square. The window in the lower electrode 13 can serve as an auxiliary light emission window for monitoring, etc., but can also be dispensed with.

A chip in which a plurality of surface emission lasers are integrally fabricated will facilitate execution of multiplexed light communications.

Also, a plurality of surface emission lasers may be integrated into a single laser device. In this case, by removing from the surface emission lasers those having a deteriorated function, there can be obtained a surface emission laser apparatus developing a satisfactory performance, which will improve the production yield.

Description has been given of the present invention in conjunction with a surface emission laser conducting an oscillation for a 1.55 μm wavelength by way of example. However, the present invention is also applicable to construction of various optoelectronic semiconductor devices. The oscillation frequency may be altered by selecting the composition and the structure of the active layer, e.g. by employing the multiple quantum well structure. To obtain a desired optical filter characteristics by the stack or laminated layer structure, the configuration of the stacks of semiconductor layers may be changed.

According to the present invention, in an optoelectronic semiconductor device having an optical active layer, not limitatively in a surface emission laser, there can be implemented a low-resistance diode structure including a desired optical filter on at least one side of the optically active layer. Thanks to the decreased resistance of the diode structure, the Joule heat generated in the operation thereof is decreased and hence there is attained a high-performance optoelectronic semiconductor device.

While particular embodiments of the invention have been shown and described, it will be obvious to those skilled in the art that various changes and modifications may be made without departing from the spirit and scope of the present invention.

We claim:

1. An optoelectronic semiconductor device comprising:
    an active layer having a first side and a second side;
    a first clad layer disposed on the first side of the active layer and a second clad layer disposed on the second side of the active layer to sandwich the active layer therebetween, the first clad layer and the second clad layer each having an effective band gap wider than the effective band gap of the active layer and an effective refractive index lower than the effective refractive index of the active layer; and
    a first stack structure disposed on the first clad layer and doped to a first conductivity type, the first stack structure comprising adjacent first and second layers alternating therein to form a laminate of alternating first and second layers, each first layer having a high effective refractive index and each second layer having a low effective refractive index, a respective boundary existing between adjacent first and second layers, a band of the first conductivity type and a band of a second conductivity type existing in the first stack structure where the second conductivity type is opposite the first conductivity type and, at each boundary between adjacent first and second layers, a discontinuity of the band of the first conductivity type being significantly smaller than a discontinuity of the band of the second conductivity type, where the discontinuity of the band of the first conductivity type does not exceed about 3 kT at a room temperature T, where k is Boltzman constant.

2. An optoelectronic semiconductor device according to claim 1, wherein the first stack structure includes an In(AlGa)As layer and an AlAsSb layer as the first and second layers, respectively.

3. An optoelectronic semiconductor device according to claim 1, wherein the first stack structure includes an AlGaAsSb layer and an InAlAs layer as the first and second layers, respectively.

4. An optoelectronic semiconductor device according to claim 1, wherein each of the first and second layers of the first stack structure has an optical length equal to about a quarter of a wavelength λ corresponding to the effective band gap of the active layer.

5. An optoelectronic semiconductor device according to claim 1, wherein the first stack structure further comprises a layer which is adjacent to the first clad layer and has an effective band gap wider than the effective band gap of the first clad layer and an effective refractive index lower than the effective refractive index of the first clad layer.

6. An optoelectronic semiconductor device according to claim 1, further comprising a second stack structure disposed on the second clad layer and doped to the second conductivity type, the second stack structure comprising adjacent first and second layers alternating therein to form a laminate of alternating first and second layers, each first layer having a high effective refractive index and each second layer having a low effective refractive index, a respective boundary existing between adjacent first and second layers, a band of the first conductivity type and a band of the second conductivity type existing in the second stack structure and, at each boundary between adjacent first and second layers, a discontinuity of the band of the second conductivity type being significantly smaller than a discontinuity of the band of the first conductivity type.

7. An optoelectronic semiconductor device according to claim 6, wherein the discontinuity of the band of the second conductivity type does not exceed about 3 kT at a room temperature T, where k is Boltzman constant.

8. An optoelectronic semiconductor device according to claim 6, wherein either one of the first and second stack structures comprises an In(AlGa)As layer and an AlAsSb layer as first and second layers, respectively, and the other one of the first and second stack structures comprises an AlGaAsSb layer and an InAlAs layer as first and second layers, respectively.

9. An optoelectronic semiconductor device according to claim 6, wherein each of the first and second layers of the second stack structure has an optical length equal to about a quarter of a wavelength λ corresponding to the effective band gap of the active layer.

10. An optoelectronic semiconductor device according to claim 6, wherein the second stack structure further comprises a layer which is adjacent to the second clad layer and has an effective band gap wider than the effective band gap of the second clad layer and an effective refractive index lower than the effective refractive index of the second clad layer.

11. An optoelectronic semiconductor device comprising:
an active layer having a first side and a second side;
a first clad layer disposed on the first side of the active layer and a second clad layer disposed on the second side of the active layer to sandwich the active layer therebetween, the first clad layer and the second clad layer each having an effective band gap wider than the effective band gap of the active layer and an effective refractive index lower than the effective refractive index of the active layer;
a first stack structure disposed on the first clad layer and doped to a first conductivity type, the first stack structure comprising adjacent first and second layers alternating therein to form a laminate of alternating first and second layers, each first layer having a high effective refractive index and each second layer having a low effective refractive index, a respective boundary existing between adjacent first and second layers, a band of a first conductivity type and a band of a second conductivity type existing in the first stack structure where the second conductivity type is opposite the first conductivity type and, at each boundary between adjacent first and second layers, a discontinuity of the band of the first conductivity type being significantly smaller than a discontinuity of a band of a second conductivity type; and
a second stack structure disposed on the second clad layer and doped to the second conductivity type, the second stack structure comprising adjacent first and second layers alternating therein to form a laminate of alternating first and second layers, each first layer having a high effective refractive index and each second layer having a low effective refractive index, a respective boundary existing between adjacent first and second layers, a band of the first conductivity type and a band of the second conductivity type existing in the second stack structure and, at each boundary between adjacent first and second layers, a discontinuity of the band of the second conductivity type being significantly smaller than a discontinuity of the band of the first conductivity type, where the discontinuity of the band of the second conductivity type does not exceed about 3 kT at a room temperature T, where k is Boltzman constant.

12. A semiconductor device comprising:
an active layer having a first side and a second side;
a first layer disposed on the first side of the active layer and a second layer disposed on the second side of the active layer to sandwich the active layer therebetween, the first and second layers each having an effective band gap wider than the effective band gap of the active layer and an effective refractive index lower than the effective refractive index of the active layer; and
a first stack structure disposed on the first layer and doped to a first conductivity type, the structure comprising adjacent first and second stack layers alternating therein to form a laminate of alternating first and second stack layers, each first stack layer having a high effective refractive index and each second stack layer having a low effective refractive index, a respective boundary existing between adjacent first and second stack layers, a band of a first conductivity type and a band of a second conductivity type existing in the first stack structure where the second conductivity type is opposite the first conductivity type and, at each boundary between adjacent first and second stack layers, a discontinuity of the band of the first conductivity type being significantly smaller than a discontinuity of the band of the second conductivity type, where the discontinuity of the band of the first conductivity type does not exceeding about 3 kT at a room temperature T, where k is Boltzman constant.

13. An optoelectronic semiconductor device comprising:

an active layer having a first side and a second side;

a first clad layer disposed on the first side of the active layer and a second clad layer disposed on the second side of the active layer to sandwich the active layer therebetween, the first clad layer and the second clad layer each having an effective band gap wider than the effective band gap of the active layer and an effective refractive index lower than the effective refractive index of the active layer; and a first stack structure disposed on the first clad layer and doped to a first conductivity type, the first stack structure comprising adjacent first and second layers alternating therein to form a laminate of alternating first and second layers, each first layer having a narrow band gap corresponding to a high effective refractive index and each second layer having a wide band gap corresponding to a low effective refractive index, a respective boundary existing between adjacent first and the second layers, a band of the first conductivity type and a band of a second conductivity type existing in the first stack structure where the second conductivity type is opposite the first conductivity type, the first and second layers being arranged to form a potential well for charge carriers of the first conductivity type in the second layer and a potential well for charge carriers of the second conductivity type in the first layer and, at each boundary between adjacent first and second layers, a discontinuity of the band of the first conductivity type being significantly smaller than a discontinuity of the band of the second conductivity type.

14. An optoelectronic semiconductor device according to claim 13, where the discontinuity of the band of the first conductivity type does not exceeding about 3 kT at a room temperature T, where k is Boltzman constant.

15. An optoelectronic semiconductor device according to claim 13, wherein the first stack structure comprises an In(AlGa)As layer and an AlAsSb layer as the first and second layers, respectively.

16. An optoelectronic semiconductor device according to claim 13, further comprising a second stack structure disposed on the second clad layer and doped to the second conductivity type, the second stack structure comprising adjacent first and second layers alternating therein to form a laminate of alternating first and second layers, each first layer having a narrow band gap corresponding to a high effective refractive index and each second layer having a wide band gap corresponding to a low effective refractive index, a respective boundary existing between adjacent first and second layers, a band of the first conductivity type and a band of the second conductivity type existing in the second stack structure, the first and second layers arranged to form a potential well for charge carriers of the second conductivity type in the second layer and a potential well for charge carriers of the first conductivity type in the first layer and, at each boundary between adjacent first and second layers, a discontinuity of the band of the second conductivity type being significantly smaller than a discontinuity of the band of the first conductivity type.

17. An optoelectronic semiconductor device according to claim 16, wherein the discontinuity of the band of the second conductivity type in the second stack structure does not exceed about 3 kT at a room temperature T, where k is Boltzman constant.

18. An optoelectronic semiconductor device according to claim 16, wherein either one of the first and second stack structures comprises an In(AlGa)As layer and an AlAsSb layer as the first and second layers, respectively, and the other one of the first and second stack structures comprises an AlGaAsSb layer and an InAlAs layer as the first and second layers, respectively.

* * * * *

UNITED STATES PATENT AND TRADEMARK OFFICE
CERTIFICATE OF CORRECTION

PATENT NO. : 5,392,307
DATED : February 21, 1995
INVENTOR(S) : Yoshihiro SUGIYAMA, et al.

It is certified that error appears in the above-indentified patent and that said Letters Patent is hereby corrected as shown below:

Title Page, Item [56], delete "Halm" and insert therefor --Holm--.

Signed and Sealed this

Twenty-fifth Day of April, 1995

Attest:

BRUCE LEHMAN

Attesting Officer     Commissioner of Patents and Trademarks